(12) United States Patent
Yusuf et al.

(10) Patent No.: US 6,256,199 B1
(45) Date of Patent: Jul. 3, 2001

(54) INTEGRATED CIRCUIT CARTRIDGE AND METHOD OF FABRICATING THE SAME

(75) Inventors: Imran Yusuf, Tempe; Hong Xie, Phoenix; Johnny M. Cook, Jr., Glendale; Peter Brandenburger, Chandler; Biju Chandran, Chandler; Hamid Ekhlassi, Chandler, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/410,648

(22) Filed: Oct. 1, 1999

(51) Int. Cl.[7] ...................................................... H05K 7/20
(52) U.S. Cl. ......................... 361/699; 361/704; 361/707; 257/721; 257/722; 174/16.3; 165/185
(58) Field of Search .................................. 361/688–692, 361/697–714, 719–728, 753–756, 802–810; 257/706–727, 678, 675; 165/80.3, 80.4, 185, 165, 80.2; 174/16.3, 52.4, 161, 163, 15.1; 439/620, 76.2, 71, 70, 72, 73; 29/602.1, 841, 854, 592.1, 832

(56) References Cited

U.S. PATENT DOCUMENTS

| 4,165,607 | * | 8/1979 | Fedorowitch et al. | 58/50 R |
|---|---|---|---|---|
| 4,679,118 | * | 7/1987 | Johnson et al. | 361/386 |
| 4,853,762 | * | 8/1989 | Ewer et al. | 357/79 |
| 4,916,523 | | 4/1990 | Sokolovsky et al. | 357/74 |
| 5,073,116 | * | 12/1991 | Beck | 439/71 |
| 5,097,387 | | 3/1992 | Griffith | 361/385 |
| 5,163,551 | * | 11/1992 | Bhatia | 206/334 |
| 5,282,111 | * | 1/1994 | Hopfer | 361/704 |
| 5,329,426 | | 7/1994 | Villani | 361/719 |
| 5,331,510 | | 7/1994 | Ouchi et al. | 361/702 |
| 5,357,404 | | 10/1994 | Bright et al. | 361/818 |
| 5,602,719 | | 2/1997 | Kinion | 361/704 |
| 5,621,615 | | 4/1997 | Dawson et al. | 361/704 |
| 5,642,262 | * | 6/1997 | Terril et al. | 361/783 |
| 5,699,227 | | 12/1997 | Kolman et al. | 361/700 |
| 5,801,929 | * | 9/1998 | Cheng | 361/807 |
| 5,802,707 | | 9/1998 | Brownell et al. | 29/740 |
| 5,864,478 | | 1/1999 | McCutchan et al. | 363/147 |
| 5,875,095 | | 2/1999 | Webb | 361/700 |
| 5,880,524 | * | 3/1999 | Xie | 257/704 |
| 5,903,436 | | 5/1999 | Brownell et al. | 361/704 |
| 5,949,647 | | 9/1999 | Kolman et al. | 361/700 |
| 5,949,648 | | 9/1999 | Liao | 361/700 |
| 5,982,635 | | 11/1999 | Menzies et al. | 361/790 |
| 5,990,549 | * | 11/1999 | Chiu et al. | 257/706 |
| 6,021,044 | | 2/2000 | Nevelle, Jr. et al. | 361/700 |
| 6,046,905 | * | 4/2000 | Nelson et al. | 361/704 |
| 6,058,013 | * | 5/2000 | Christopher et al. | 361/704 |
| 6,065,530 | * | 5/2000 | Austin et al. | 165/80.3 |

FOREIGN PATENT DOCUMENTS

407113840A * 5/1995 (JP) .

* cited by examiner

*Primary Examiner*—Leo P. Picard
*Assistant Examiner*—Michael Datskovsky
(74) *Attorney, Agent, or Firm*—Schwegman, Lundberg, Woessner & Kluth, P.A.

(57) ABSTRACT

An integrated circuit cartridge and method has been described. The cartridge includes a heat pipe that comes in thermal contact with at least one integrated circuit die. A spring clip is utilized to provide a compressive force to maintain a substantially even bond line thickness in the presence of opposing forces, such as forces caused by thermal cycling, power cycling, shocks, and vibration. The spring clip can modulate the compressive force applied as a function of parameters on the spring clip. Parameters include load arm width, load arm thickness, load arm curvature, and the location of tabs relative to load arms. A cartridge cover supplies physical protection for pins that protrude from the cartridge. The cartridge cover also supplies key features that aid in alignment of the pins and a socket.

20 Claims, 7 Drawing Sheets

INTEGRATED CIRCUIT CARTRIDGE AND METHOD OF FABRICATING THE SAME

FIELD

The present invention relates generally to computer board and chip packaging, and more specifically to chip package design and manufacturing.

BACKGROUND

Semiconductor technology continues to advance at a rapid rate. Advancements include increases in semiconductor die density which allows for ever-increasing amounts of circuitry in any given die size, and also include increases in speeds at which semiconductor circuits operate. Higher semiconductor die densities and increased semiconductor circuit speeds combine to increase the computational speed in computers and other electronic devices.

Along with increased density and speed of semiconductor devices comes increased power consumption. State-of-the-art semiconductor circuits can consume considerable amounts of power, much of which gets dissipated as heat. The problem of increased heat dissipation is compounded by the fact that as semiconductor dice shrink, the amount of heat to be dissipated per unit area of semiconductor die increases.

Heat is typically dissipated from semiconductor dice through packages in which they are housed. A surface area of the semiconductor die is typically thermally bonded to a part of the package for the purpose of dissipating heat from the die. As the combined die and package undergo thermal and physical stress in normal testing and usage, the integrity of the thermal bond tends to degrade. As long as the die can continue to dissipate enough heat, the degradation can be tolerated.

As the need for power dissipation increases, the ability to withstand degradation of thermal bonds decreases. Continued integrity of thermal bonds between semiconductor dice and their packages after undergoing physical and thermal stresses can help high power semiconductor devices dissipate heat.

The demand for semiconductors also continues to increase, and as a result, high power semiconductors are being manufactured in greater and greater quantities. Manufacturability is an important consideration in any high-volume production environment, and semiconductors and their associated packages are no exception.

For the reasons stated above, and for other reasons stated below which will become apparent to those skilled in the art upon reading and understanding the present specification, there is a need in the art for a readily manufacturable semiconductor packaging solution capable of efficiently dissipating heat.

SUMMARY

In one embodiment, a packaged integrated circuit includes a cartridge housing, an integrated circuit die disposed in the cartridge housing, a layer of thermally conductive material disposed on the integrated circuit die, a heat pipe disposed on the layer of thermally conductive material, a thickness of the thermally conductive material forming a bond line thickness, and a spring clip engaged to the cartridge housing, wherein the spring clip provides a compressive force that works to decrease the bond line thickness.

In another embodiment, a method of assembling a cartridge for housing an integrated circuit die includes coupling a heat pipe to a cartridge housing, the heat pipe having a first side and an opposing side, the opposing side contacting the cartridge housing, the cartridge housing having a plurality of tab engaging points on an external surface, and coupling a substrate assembly that includes the integrated circuit die to the heat pipe, such that a junction between the integrated circuit die and first side of the heat pipe forms a bond line. The method further includes mounting a spring clip to the cartridge housing, the spring clip including a plurality of load arms contacting the substrate assembly, and including two tab arms substantially perpendicular to the plurality of load arms, each tab arm having tabs that engage the tab engaging points on the cartridge housing, thereby providing a compressive force on the integrated circuit die relative to the heat pipe.

DESCRIPTION OF EMBODIMENTS

In the following detailed description of the embodiments, reference is made to the accompanying drawings which show, by way of illustration, specific embodiments in which the invention may be practiced. It is to be understood that other embodiments may be utilized and structural changes may be made without departing from the scope of the present invention.

Figure 1:
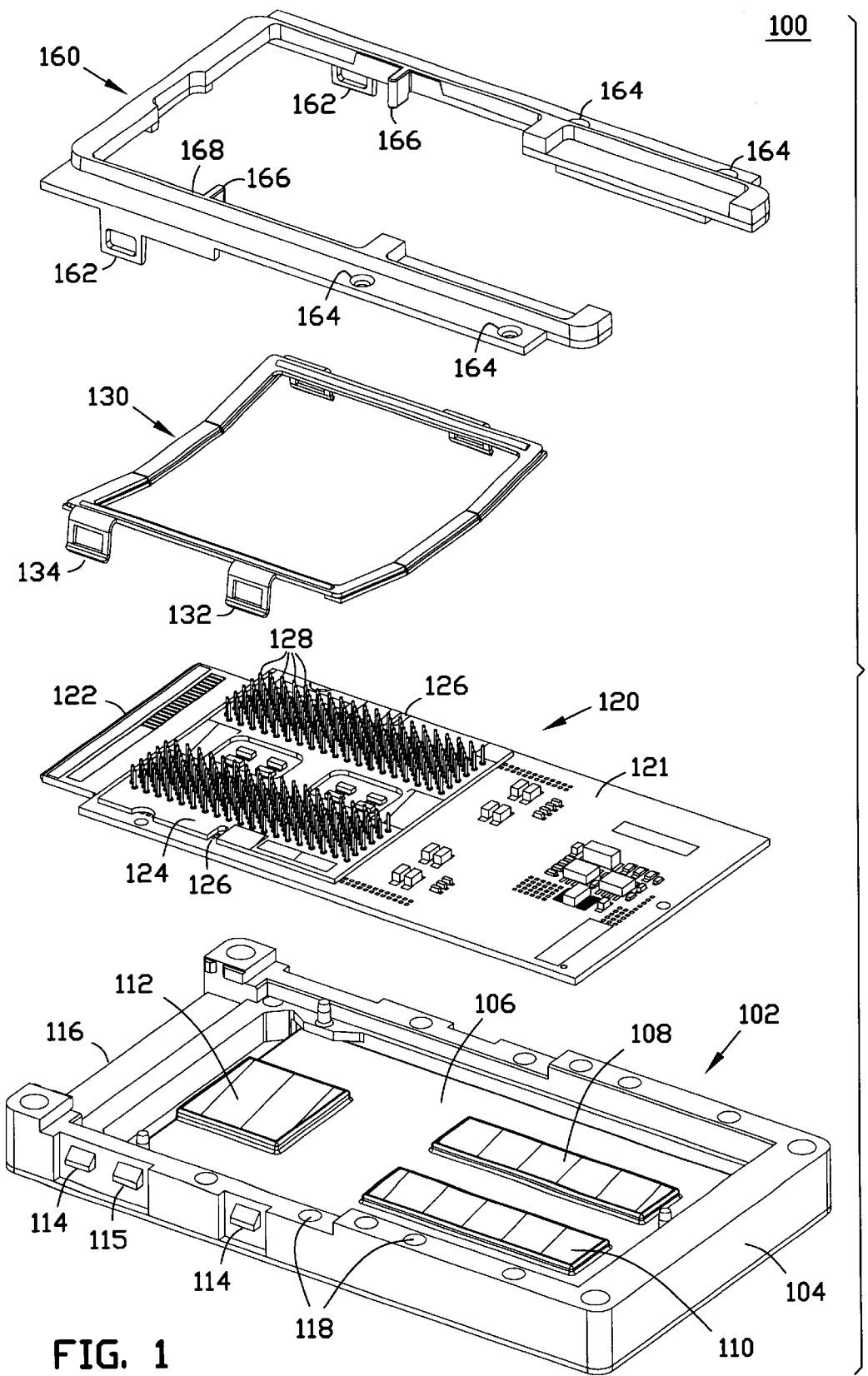
FIG. 1 is a exploded isometric view of a cartridge according to one embodiment of the present invention.

FIG. 1 shows an exploded isometric view of a cartridge according to one embodiment of the present invention. Cartridge 100 includes lid assembly 102, substrate assembly 120, spring clip 130, and cartridge cover 160. Lid assembly 102 includes cartridge housing 104 and heat pipe 106. Cartridge housing 104 is a housing with an open face through which heat pipe 106 can be accessed. During manufacture, heat pipe 106 can be inserted into cartridge housing 104 through the open face, or cartridge housing 104 can be molded about heat pipe 106.

Cartridge housing 104 includes features such as recess 116, fastening points 118, tab engaging points 114, and cover engaging points 115. Tab engaging points 114 are points at which spring clip 130 attaches to cartridge housing 104, as is more fully explained below. Cover engaging points 115 are points at which cartridge cover 160 attaches to cartridge housing 104, as is also explained more fully below.

Heat pipe 106 is a highly efficient conductor of heat. In one embodiment, heat pipe 106 is a heat pipe which includes an internal vapor chamber, wicking structure, and working fluid, that combine to efficiently transfer heat. Heat pipes of this sort are typically used to transfer heat from one location to another; one example being a notebook computer where heat pipes can be used to transfer heat from a location buried within the computer to a corner of the computer where a fan exists. In the embodiment of FIG. 1, heat pipe 106 efficiently spreads heat across the face of heat pipe 106 such that the heat can be dissipated efficiently. When heat pipe 106 is functioning efficiently, the temperature gradient is very low across the surface of heat pipe 106.

As shown in FIG. 1, heat pipe 106 includes pedestals 108, 110, and 112. Pedestals 108, 110, and 112 are points on heat pipe 106 that come in thermal contact with integrated circuit dice, and receive heat therefrom. The junction between semiconductor dice and pedestals forms a "bond line" that has a thickness across the junction boundary. Efficient heat transfer takes place when integrated circuit dice are pressed firmly and evenly against the pedestals such that a substantially uniform bond line thickness is maintained. Three pedestals are shown on heat pipe 106 in FIG. 1. In this embodiment, three integrated circuit dice are on the underside of substrate assembly 120.

Substrate assembly 120 includes substrate 121, pin connector 124 having a plurality of pins 128, and also includes integrated circuit dice (not shown) attached to the underside of substrate 121. Substrate 121 can be any type of substrate capable of accepting circuitry in the form of integrated circuit dice. Substrate 121 is typically a printed circuit board, such as a board made from FR4 material. Attached to substrate 121 is pin connector 124. Also attached to substrate 121 is at least one integrated circuit die (not shown).

Substrate 121 also includes edge connector 122. Edge connector 122 can couple electrical signals to and from substrate assembly 120, and can also be used to supply power to circuitry mounted on substrate assembly 120. When power is brought to substrate assembly 120 using edge connector 122, pins 128 on pin connector 124 are available to carry signals since they are not used to transfer power. In high-power applications, such as those that dissipate significant amounts of heat, edge connector 122 can devote significant surface area to supply adequate current with low impedance.

In one embodiment, integrated circuit dice are directly mounted to substrate 121. In another embodiment, integrated circuit dice are mounted to a carrier such as an organic land grid array, and the organic land grid array is then mounted to substrate 121. The physical relationship between integrated circuit dice and substrate 121 is explained in more detail with reference to FIG. 3 below.

Substrate 121 is, preferably, a printed circuit board that physically and electrically couples integrated circuit dice to pins 128 which can be received by a socket. The integrated circuit dice (not shown) are those mounted on the underside of substrate 121. Pin connector 124 can be mounted to substrate 121 using conventional mounting technologies, such as surface mount technology. The embodiment of FIG. 1 shows pin connector 124 surface mounted to substrate 121.

During assembly, substrate assembly 120 is lowered into lid assembly 102. Substrate assembly 120 is registered with cartridge housing 104, as is heat pipe 106. A thermally conductive material can be disposed on the integrated dice or on pedestals 108, 110, and 112 prior to substrate assembly 120 being lowered into lid assembly 102. Integrated circuit dice on the underside of substrate assembly 120 contact pedestals 108, 110, and 112. The embodiment of FIG. 1 shows three pedestals which can correspond to substrate assembly 120 having three integrated circuit dice (not shown) mounted to the underside of substrate 121. The three integrated circuit dice can be a processor, and two support chips such as cache memory or memory controllers. In another embodiment, a single pedestal exists on heat pipe 106 and a single semiconductor die is attached to the underside of substrate assembly 120. In another embodiment, heat pipe 106 has three pedestals, and substrate 121 has five integrated circuit dice mounted thereon, such that at least one pedestal is in thermal contact with more than one integrated circuit die. Any number of pedestals and semiconductor dice can be included without departing from the scope of the present invention.

Cartridge assembly 100 also includes spring clip 130. Spring clip 130 includes tabs 132 and 134 that mate to tab engaging points 114 on cartridge housing 104. When substrate assembly 120 is in its proper place aligned with lid assembly 102, spring clip 130 can be engaged with cartridge housing 104 using tabs and tab engaging points to hold substrate assembly 120 in place relative to lid assembly 102. Spring clip 130 is discussed in further detail with reference to FIGS. 2 and 4 below.

Cartridge cover 160 mates with cartridge housing 104 at multiple points. Tabs 162 mate with tab engaging points 115, and fastening points 164 mate with fastening points 118. Cartridge cover 160 has key features 166 and lip 168. When cartridge cover 160 is mated with cartridge housing 104, lip 168 extends vertically such that the pins on pin connector 124 are protected from damage by handling. Key features 166 mate with keyway features 126 on pin connector 124 to align cartridge cover 160 to pin connector 124. In one embodiment, fastening points 164 are elongated holes capable of receiving a fastener such as a screw, and fastening points 118 are threaded holes also capable of receiving a fastener such as a screw. When cartridge cover 160 is mated with cartridge housing 104, tabs 162 engage tab engaging points 115, key features 166 register cartridge cover 160 to pin connector 124 by aligning with keyway features 126, and fasteners (not shown) can attach cartridge cover 160 to cartridge housing 104 at fastening points 164 and 118.

By fastening cartridge cover 160 to cartridge housing 104 in this manner, cartridge cover 160 is located relative to pin connector 124. Elongated holes in cartridge cover 160 allow it to "float" relative to cartridge housing 104 while it is being located relative to pin connector 124 by virtue of the key features, and then is fastened to cartridge housing 104. Cartridge cover is fastened to cartridge housing 104, but its final location, within limits, is determined by the location of pin connector 124.

Cartridge cover 160 has been described herein with key features, and pin connector 124 has been described herein with keyway features. One skilled in the art will understand that other alignment mechanisms can be used while still practicing the present invention. For example, pin connector 124 can have key features rather than keyway features, and cartridge cover 160 can have keyway features rather than key features. In another embodiment, the keyway features on pin connector 124 are holes, and the key features on cartridge cover 160 are pins.

Figure 2:
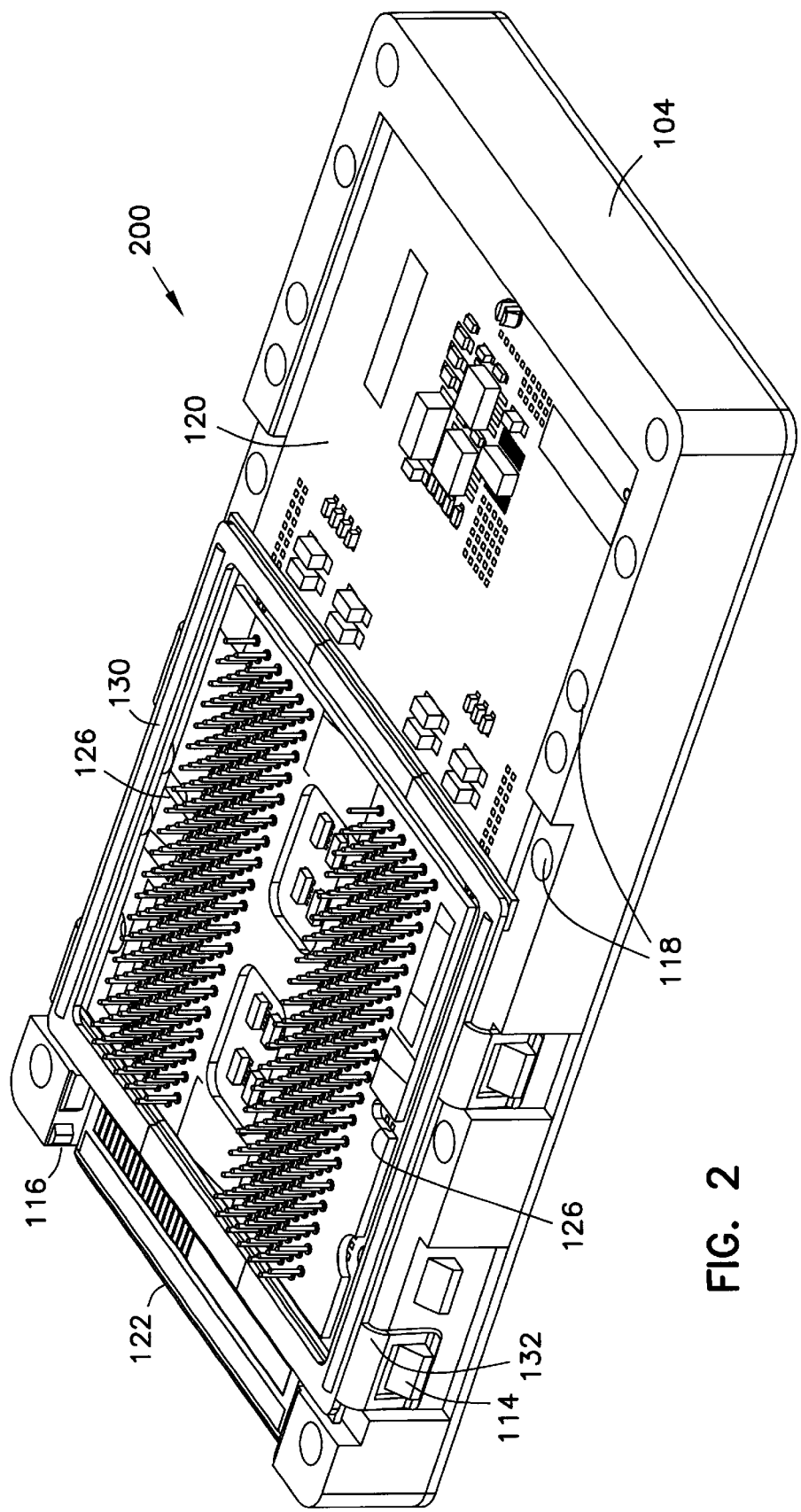
FIG. 2 is an isometric view of a partially assembled cartridge according to one embodiment of the present invention.

FIG. 2 shows an isometric view of a partially assembled integrated circuit cartridge in accordance with an embodiment of the invention. Partially assembled cartridge 200 includes lid assembly 102, substrate assembly 120, and spring clip 130. Heat pipe 106 (FIG. 1) is included within cartridge housing 104 to form lid assembly 102 (FIG. 1), but cannot be seen in FIG. 2 by virtue of its position beneath substrate assembly 120. Partially assembled cartridge 200 includes at least one integrated circuit die on the underside of substrate assembly 120. The at least one integrated circuit die is in thermal contact with a pedestal of the heat pipe through a thermally conductive layer of material. Spring clip 130, when engaged with the cartridge housing 104, provides a compressive force to hold substrate assembly 120 together with lid assembly 102 (FIG. 1). The compressive force functions to hold the partially assembled cartridge together, and also functions to reduce bond line thickness between semiconductor dice and pedestals of the heat pipe.

Packaged semiconductors undergo physical stress and thermal stress as part of testing and normal usage. Typical tests performed on packaged parts include thermal cycling, power cycling, shock tests, and vibration tests. Normal operation also exposes packaged parts to power cycling, thermal cycling, shocks, and vibration. If a package or a semiconductor die should warp as a result of these forces, bond line thickness variations can result. Variations in bond line thickness can decrease the efficiency of heat transfer, possibly causing the failure of high-powered devices that generate significant amounts of heat. The compressive force supplied by spring clip 130 functions to maintain bond line thickness at acceptable levels, thereby increasing reliability of high-powered devices that have undergone stresses due to testing and normal use.

In the embodiment shown in FIG. 2, spring clip 130 comes in contact with substrate assembly 120 and engages with cartridge housing 104. In this embodiment, spring clip 130 does not contact pin connector 124, and the pins of pin connector 124 protrude through the opening in spring clip 130. In another embodiment, spring clip 130 contacts pin connector 124, thereby including pin connector 124 in the stack of components subject to the compressive force.

Figure 3:
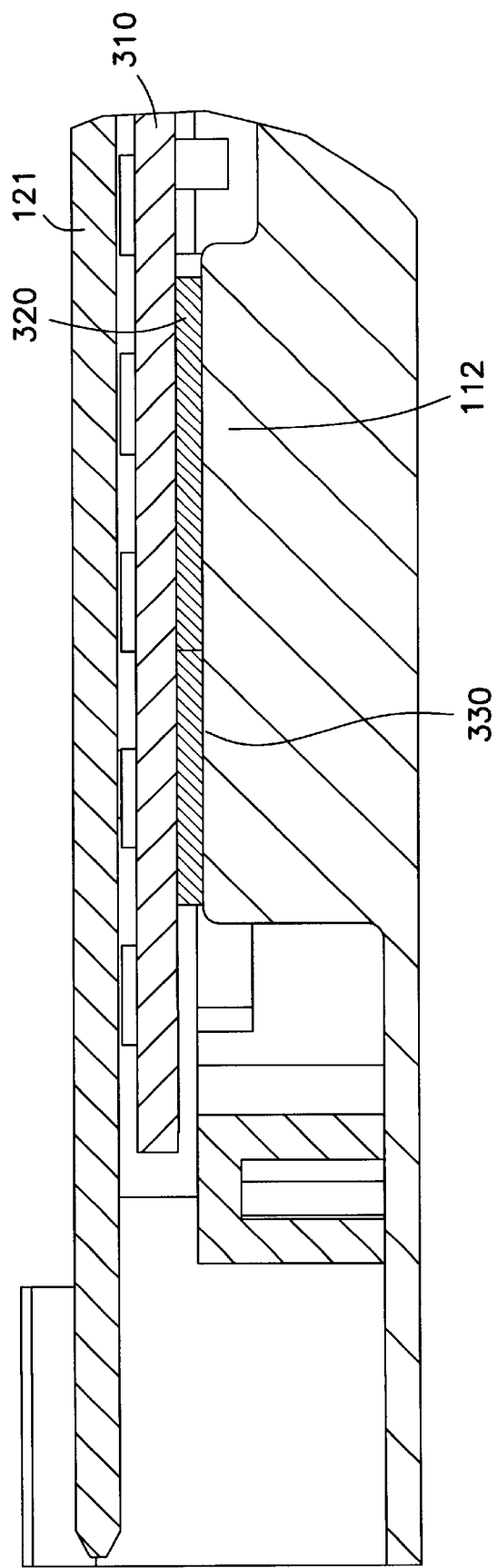
FIG. 3 is a cross section of a partially assembled cartridge according to one embodiment of the present invention.

FIG. 3 shows a cross-section of a partially assembled integrated circuit cartridge in accordance with an embodiment of the invention. FIG. 3 shows integrated circuit die 320 thermally coupled to pedestal 112 of heat pipe 106 (FIG. 1). The junction created at the interface between integrated circuit die 320 and pedestal 112 is bond line 330. As previously described, a thermally conductive material is generally disposed between integrated circuit die 320 and pedestal 112 prior to assembly. The thickness of the thermally conductive material, and the compressive force applied to semiconductor device 320 relative to pedestal 112 influence the size and variability of the bond line thickness at bond line 330. The compressive force provided by spring clip 130 (FIG. 2) supplies a constant loading that takes up variations in bond line thickness, and provide a more consistent thermal interface.

In the embodiment of FIG. 3, semiconductor device 320 is shown mounted to an organic land grid array, which is in turn mounted to substrate 121. An organic land grid array is a small circuit board that receives a flip mounted semiconductor die such that bond wires can be avoided for the use of electrical connections. Organic land grid array 310 is mechanically and electrically coupled to substrate 121. Organic land grid array 310 can be mounted to substrate 121 using any of a variety of methods, such as ball grid array (BGA) attachment.

In one embodiment, organic land grid array 310 has a single integrated circuit mounted thereto. In this embodiment, when multiple integrated circuit dice are present, multiple organic land grid arrays are also present. In another embodiment, multiple dice are mounted on a single organic land grid array, such as in the case of a multi-chip module.

Figure 4:
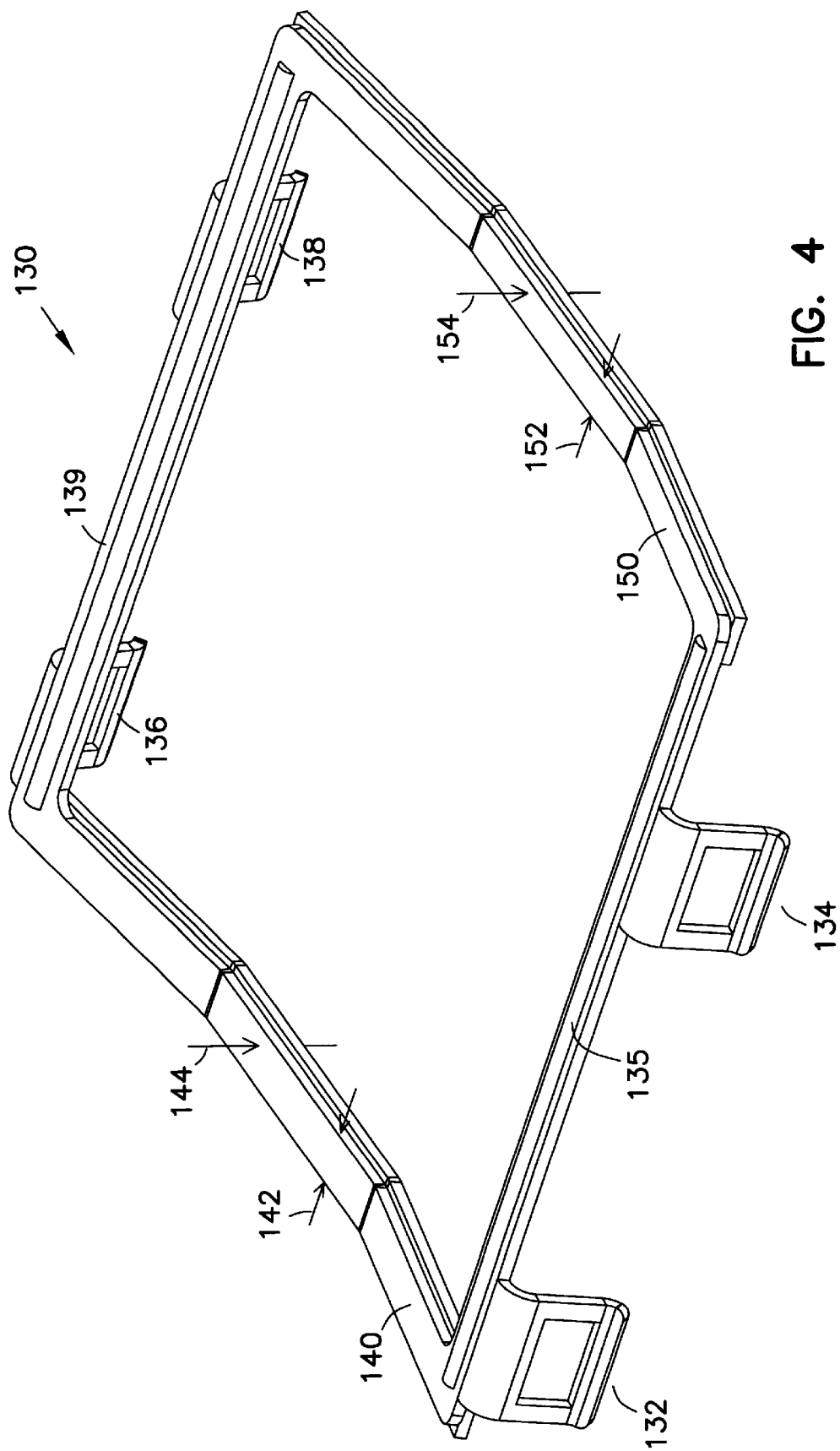
FIG. 4 is an isometric view of a spring clip according to one embodiment of the present invention.

FIG. 4 shows a spring clip according to one embodiment of the present invention. Spring clip 130 includes tabs 132, 134, 136, and 138. Tabs 132 and 134 attach to spring clip 130 at tab arm 135. Likewise, tabs 136 and 138 attach to spring clip 130 at tab arm 139. Tab arms 135 and 139 are substantially parallel to each other, and are substantially perpendicular to load arms 140 and 150. Load arms 140 and 150 are shown in contact with substrate assembly 120 in FIG. 2. In the embodiment of FIG. 4, load arms 140 and 150 are curved and have discrete segments. Each load arm is shown with three segments, each segment at a slight angle to the others. When spring clip 130 is engaged with cartridge housing 104 (FIG. 1), load arms 140 and 150 are deflected so as to substantially remove the curvature, thereby resulting in a compressive force. In another embodiment, load arms 140 and 150 are smoothly curved along their lengths, rather than being curved at discrete segments.

Load arm 140 has width 142 and thickness 144. Likewise, load arm 150 has width 152 and thickness 154. The amount of compressive force supplied by each of the load arms can be modulated by varying width and thickness. For example, load arm 140 can be made to supply a greater compressive force than load arm 150 if width 142 is greater than width 152. Likewise, load arm 140 can also be made to supply a greater compressive force than load arm 150 if thickness 144 is greater than thickness 154. In the embodiment of FIG. 4, extra thickness is supplied by adding a second layer of material to a load arm. In another embodiment, spring clip 130 is molded with varying thicknesses, such that one load arm is thicker than the other load arm.

The locations of tabs relative to the tab arms can also be used to vary the compressive force applied by one load arm relative to another. For example, in the embodiment of FIG. 4, tab 132 is closer to load arm 140 than tab 134 is to load arm 150. Likewise, tab 136 is closer to load arm 140 than tab 138 is to load arm 150. If other parameters such as the width and thickness are substantially equal for load arms 140 and 150, the proximity of a tab to a load arm can also cause one load arm to supply more compressive force than another load arm. In the embodiment of FIG. 4, load arm 140 supplies a greater compressive force than load arm 150 as a result of tab locations.

Any combination of tab location, load arm thickness, and load arm width can be utilized by spring clip 130 to modulate the compressive force applied to an object. Although spring clip 130 is described herein with reference to an integrated circuit cartridge, one skilled in the art will recognize that spring clip 130 has uses in many areas of technology that can benefit from a compressive force such as the compressive force applied by spring clip 130.

Spring clip 130 has been described with substantially parallel tab arms being substantially perpendicular to load arms. In other embodiments, tab arms are not parallel, and they are not perpendicular to load arms. Spring clips having arms that are not parallel or perpendicular are included within the scope of the present invention.

Figure 5:
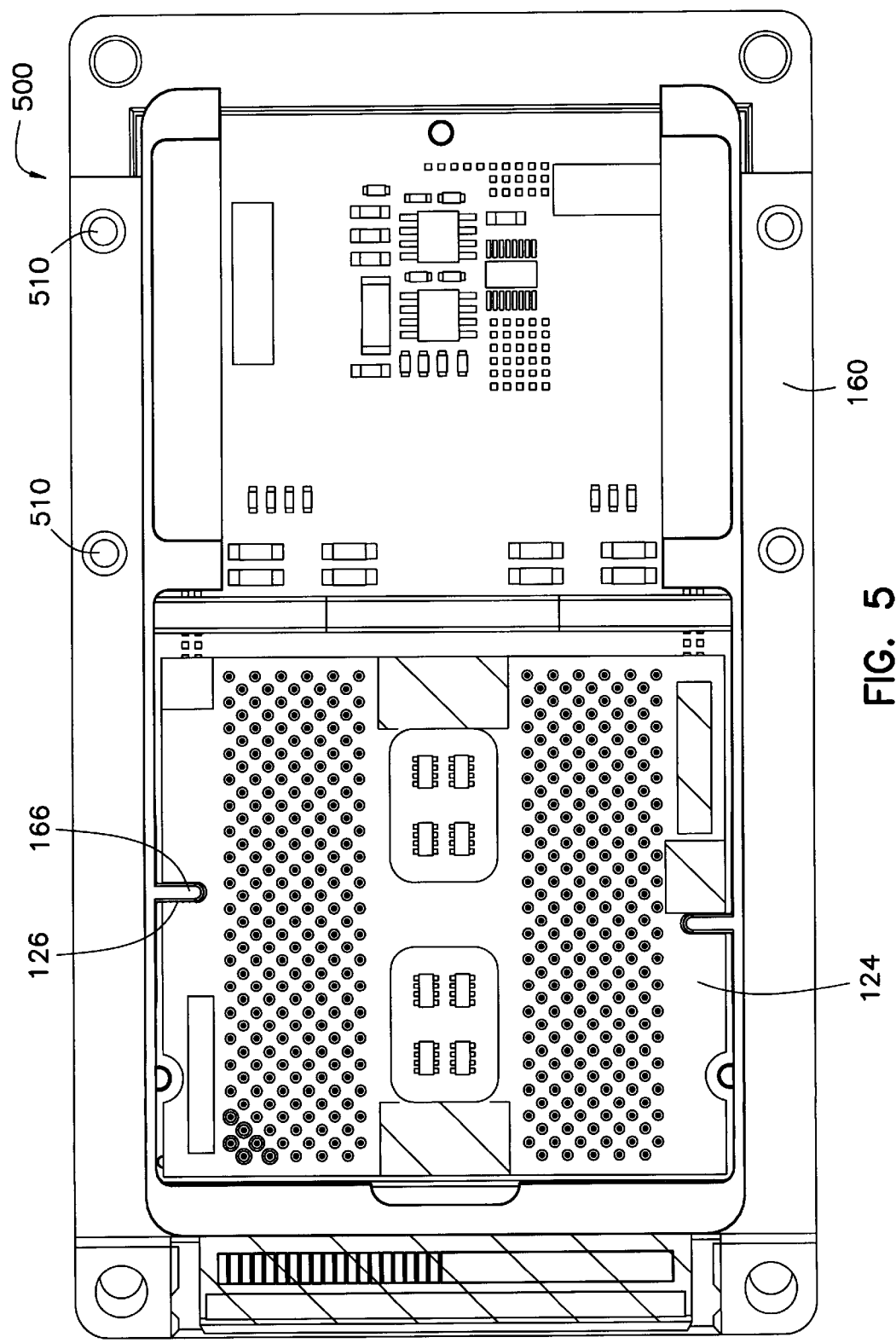
FIG. 5 is a top view of an assembled cartridge according to one embodiment of the present invention.

FIG. 5 shows a top view of an assembled cartridge in accordance with an embodiment of the invention. Cartridge 500 is partially assembled cartridge 200 (FIG. 2) with cartridge cover 160 (FIG. 1) in place. Cartridge cover 160 is registered to pin assembly 124 using key features 166 on cartridge cover 160 and keyway features 126 on pin connector 124. Cartridge cover 160 is attached to cartridge housing 104 with fasteners 510. Fasteners 510 are any type of fastener capable of attaching cartridge cover 160 to cartridge housing 104. In the embodiment shown in FIG. 5, fasteners 510 have passed through elongated holes in cartridge cover 160, thereby allowing cartridge cover 160 to "float" relative to cartridge housing 104 while registering to pin connector 124. Fasteners 510 hold cartridge cover 160 in place against cartridge housing 104 with an orientation established in part by key features 166 and keyway features 126.

After assembly, key features 166 are in substantially fixed locations relative to pins on pin connector 124. A socket capable of receiving cartridge 500 can utilize key features 166 for alignment of cartridge 500 to the socket prior to pins making contact to receptacles in the socket. By using key features 166 to align cartridge 500 to a socket prior to pins making contact, reliability of a connection can be increased, and pin damage as a result of mishandling can decrease.

Figure 6:
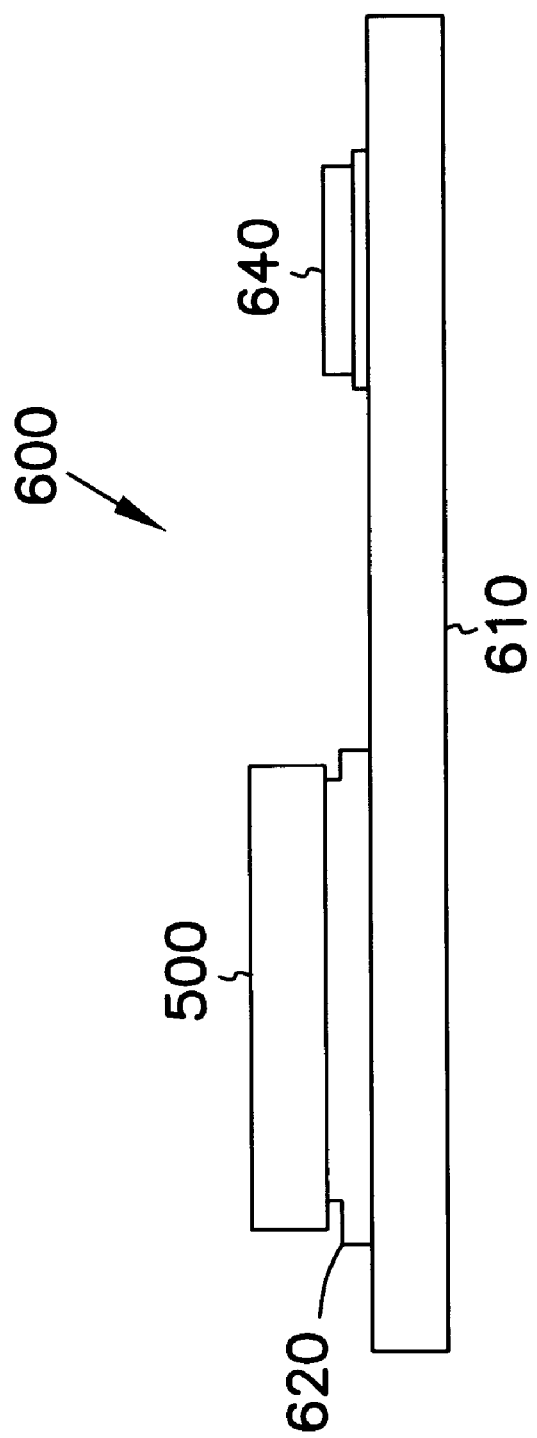
FIG. 6 shows a processing system according to one embodiment of the present invention.

FIG. 6 shows a processing system in accordance with an embodiment of the invention. Processing system 600 includes cartridge 500, socket 620, electronic component 640, and motherboard 610. Cartridge 500 includes lid assembly 102, substrate assembly 120, spring clip 130, and cartridge cover 160. Socket 620 is a socket that receives pins on pin connector 124. Socket 620 also includes keyway features (not shown) that mirror keyway features 126 on pin connector 124. Key features 166 of cartridge cover 160 mate with keyway features on socket 620 prior to pins included within cartridge 500 making contact with pin receptacles (not shown) in socket 620.

Socket 620 is coupled to motherboard 610, thereby providing a physical and electrical connection between motherboard 610 and cartridge 500. Likewise, electronic component 640 is also coupled to motherboard 610. Processing system 600 provides communications between cartridge 500 and electronic component 640 while providing an efficient heat dissipation solution for integrated circuits housed within cartridge 500. The result is a processing system capable of operating at increased speeds with increased reliability.

Figure 7:
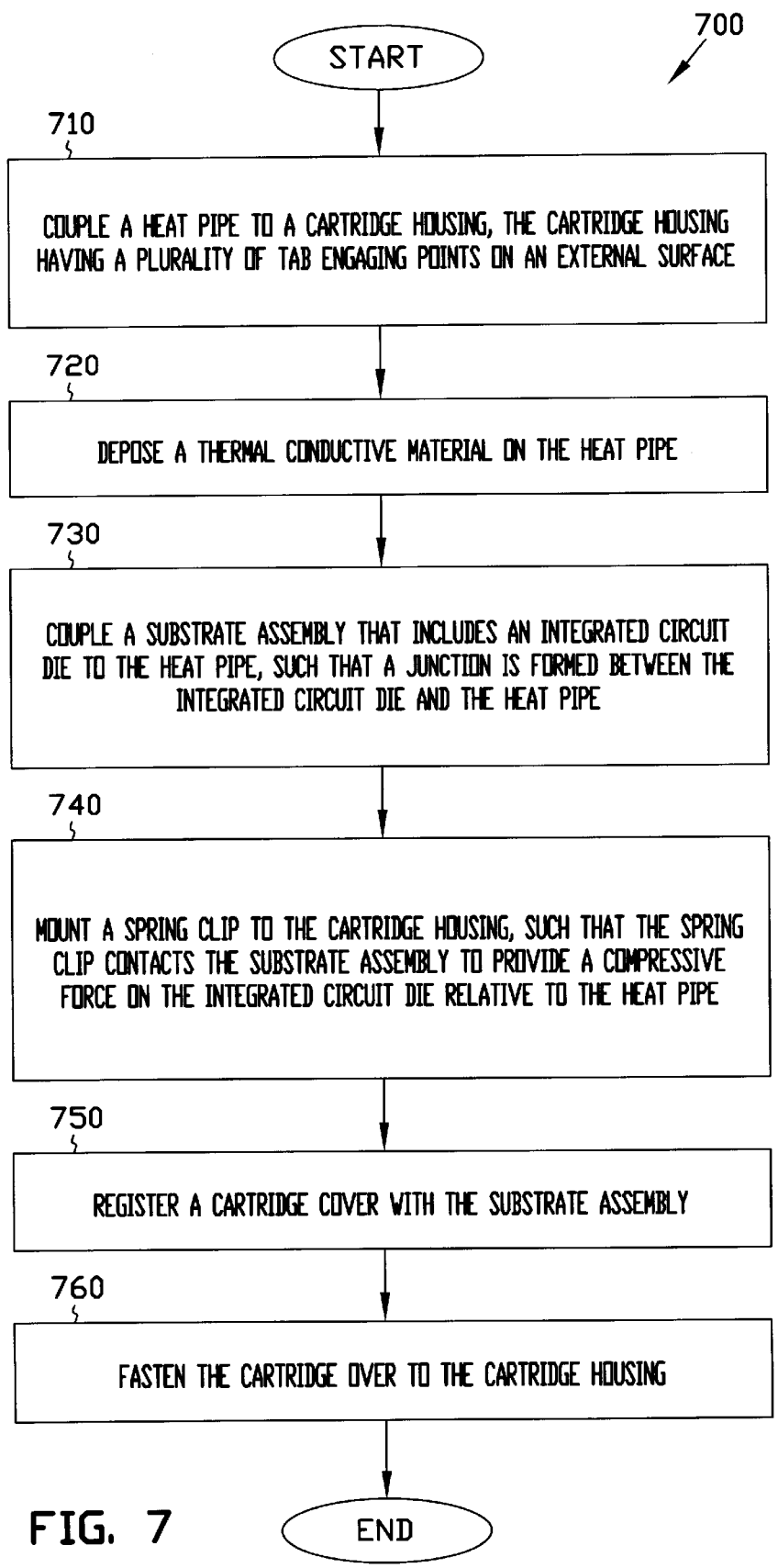
FIG. 7 is a flowchart of a method for assembling a cartridge in accordance with one embodiment of the present invention.

FIG. 7 shows a flowchart for a method of assembling an integrated circuit cartridge in accordance with an embodiment of the invention. Method 700 begins with action box 710 when a heat pipe is coupled to a cartridge housing. The cartridge housing has a plurality of engaging points on an external surface. In one embodiment, the heat pipe can be coupled to the cartridge housing through a mechanical process such as bringing a complete heat pipe together with a complete cartridge housing. In another embodiment, the cartridge housing can be coupled to the heat pipe by integrally forming a cartridge housing out of a material such as plastic about a previously existing heat pipe. Tab engaging points on an external surface of the cartridge housing can be like those shown in FIG. 2 as tab engaging points 114.

In action box 720, a thermally conductive material is disposed on the heat pipe. In one embodiment, the heat pipe includes pedestals, where each pedestal functions to make a thermal connection with a heat producing body. Disposing a thermally conductive material on the pedestal of the heat pipe facilitates the thermal connection. In action box 730, a substrate assembly that includes an integrated circuit die is coupled to the heat pipe. When the substrate assembly is coupled to the heat pipe, a junction is formed between the integrated circuit die and the heat pipe. In the embodiment including pedestals on the heat pipe, the junction is formed between the integrated circuit die and the pedestal on the heat pipe. Such a junction is shown as bond line 330 in FIG. 3.

In action box 740, a spring clip is mounted to the cartridge housing. The spring clip engages the cartridge housing at the engaging points on the external surface. The spring clip contacts the substrate assembly to provide a compressive force on the integrated circuit die relative to the heat pipe. The compressive force applied by the spring clip functions to maintain bond line 330 (FIG. 3) in the presence of undesirable forces. Undesirable forces can be caused by phenomenon such as thermal cycling, power cycling, shock, and vibration.

In action box 750, the cartridge cover is registered with the substrate assembly, and in action box 760, the cartridge cover is fastened to the cartridge housing. Method 700 is a method of assembling a cartridge which houses a semiconductor die. The resultant cartridge includes a compressive force that works to maintain an even bond line between an integrated circuit die and a heat pipe, thereby providing increased efficiency and reliability.

Method 700 provides for the assembly of a cartridge utilizing a single axis of motion. For example, referring now to FIG. 1, if an assembly axis is defined vertically in FIG. 1 such that it is substantially parallel to the compressive force supplied by spring clip 130, it can be seen that each item involved in method 700 moves substantially parallel to the assembly axis.

Heat pipe 106 moves substantially parallel to the assembly axis as it is assembled through the open face of cartridge housing 104. Substrate assembly 120 comes into contact with lid assembly 102 as it moves substantially parallel to the assembly axis. Spring clip 130 provides a compressive force and engages cartridge housing 104 as it moves substantially parallel to the assembly axis. Also, cartridge cover 160 is attached to cartridge housing 104 as it is brought in contact therewith while moving substantially parallel to the assembly axis. Reliability in manufacturing is increased and manufacturing costs are decreased by virtue of the single assembly axis utilized by method 700.

CONCLUSION

An integrated circuit cartridge and method has been described. The cartridge includes a heat pipe that comes in thermal contact with at least one semiconductor die. A spring clip is utilized to provide a compressive force to maintain a substantially even bond line thickness in the presence of opposing forces, such as forces caused by thermal cycling, power cycling, shocks, and vibration. The spring clip can modulate the compressive force applied as a function of parameters on the spring clip. Parameters include load arm width, load arm thickness, load arm curvature, and the location of tabs relative to load arms. A cartridge cover supplies physical protection for pins that protrude from the cartridge. The cartridge cover also supplies key features that aid in alignment of the pins and a socket. A method of assembling an integrated circuit cartridge includes a series of operations that can be performed in a single axis. Single axis assembly aids in the manufacturability of the cartridge.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A cartridge comprising:
    a cartridge housing having an open face, and having a plurality of tab engaging points on a first side and a second side, wherein the first and second sides oppose each other;

at least one assembly including an integrated circuit die, the at least one assembly being disposed within the cartridge housing and between the first and second sides, the at least one assembly including a plurality of pins accessible through the open face; and a spring clip contacting the at least one assembly, and engaging the tab engaging points such that a compressive force is applied to the at least one assembly, the spring clip having an opening through which the plurality of pins protrude.

2. The cartridge of claim 1 wherein the at least one assembly comprises:

a substrate having a first side and a second side substantially parallel to the first side, wherein the integrated circuit is coupled to the first side; and a heat pipe in thermal contact with the integrated circuit die.

3. The cartridge of claim 2 further comprising a layer of thermally conductive material disposed between the heat pipe and the integrated circuit die, the layer having a thickness defining a bond line thickness, wherein the substrate is aligned such that the compressive force reduces the bond line thickness.

4. The cartridge of claim 3 further comprising a pin assembly affixed to the second side of the substrate, the pin assembly having the plurality of pins protruding outward from the open face of the cartridge housing.

5. A cartridge comprising:

a cartridge housing having an open face, and having a plurality of tab engaging points on a first side and a second side, wherein the first and second sides oppose each other;

at least one assembly including an integrated circuit die, the at least one assembly being disposed within the cartridge housing and between the first and second sides, the at least one assembly being accessible through the open face, the at least one assembly comprising a substrate having a first side and a second side substantially parallel to the first side, wherein the integrated circuit is coupled to the first side;

a heat pipe in thermal contact with the integrated circuit die;

a spring clip contacting the at least one assembly, and engaging the tab engaging points such that a compressive force is applied to the at least one assembly;

a layer of thermally conductive material disposed between the heat pipe and the integrated circuit die, the layer having a thickness defining a bond line thickness, wherein the substrate is aligned such that the compressive force reduces the bond line thickness; and a pin assembly affixed to the second side of the substrate, the pin assembly having a plurality of pins protruding outward from the open face of the cartridge housing, wherein the pin assembly has keyway features that are substantially similar to socket keyway features in a socket on a motherboard to which the cartridge can be mated.

6. The cartridge of claim 5 further comprising a cartridge cover having key features that engage the keyway features of the pin connector.

7. The cartridge of claim 6 wherein the cartridge cover is located relative to the cartridge housing using the key features and keyway features, and is fastened to the cartridge housing.

8. A cartridge comprising:

a cartridge housing having an open face, and having a plurality of tab engaging points on a first side and a second side, wherein the first and second sides oppose each other;

at least one assembly including an integrated circuit die, the at least one assembly being disposed within the cartridge housing and between the first and second sides, the at least one assembly being accessible through the open face, the at least one assembly comprising a substrate having a first side and a second side substantially parallel to the first side wherein the integrated circuit is coupled to the first side, and a heat pipe in thermal contact with the integrated circuit die; and a spring clip contacting the at least one assembly, and engaging the tab engaging points such that a compressive force is applied to the at least one assembly;

wherein the substrate includes an edge connector that is received by a recess in a third side of the cartridge housing.

9. A packaged integrated circuit comprising:

a cartridge housing;

an integrated circuit die disposed in the cartridge housing;

a layer of thermally conductive material disposed on the integrated circuit die;

a heat pipe disposed on the layer of thermally conductive material, a thickness of the thermally conductive material forming a bond line thickness;

a spring clip engaged to the cartridge housing, wherein the spring clip provides a compressive force that works to decrease the bond line thickness;

a substrate to which the integrated circuit die is mounted, wherein the compressive force is applied by the spring clip to the substrate; and a pin connector mounted to the substrate opposite the integrated circuit die, wherein the pin connector has a plurality of pins protruding through an opening in the spring clip.

10. The packaged integrated circuit of claim 9 further including a cartridge cover having key features that mate to keyway features in the pin connector.

11. The packaged integrated circuit of claim 9 wherein the substrate includes an edge connector for providing power to the substrate.

12. A processing system comprising:

a motherboard configured to receive a plurality of circuits; and a packaged integrated circuit coupled to the motherboard, wherein the packaged integrated circuit comprises:

a cartridge housing;

an assembly including an integrated circuit die disposed in the cartridge housing, the assembly having a plurality of pins protruding therefrom;

a layer of thermally conductive material disposed on the integrated circuit die;

a heat pipe disposed on the layer of thermally conductive material, a thickness of the thermally conductive material forming a bond line thickness; and a spring clip engaged to the cartridge housing, wherein the spring clip provides a compressive force that works to decrease the bond line thickness, and wherein the plurality of pins protrude through an opening in the spring clip.

13. A method of assembling a cartridge for housing an integrated circuit die, the method comprising:

coupling a heat pipe to a cartridge housing, the heat pipe having a first side and an opposing side, the opposing side contacting the cartridge housing, the cartridge housing having a plurality of tab engaging points on an external surface;

coupling a substrate assembly that includes the integrated circuit die to the heat pipe, such that a junction between the integrated circuit die and the first side of the heat pipe forms a bond line, and such that a plurality of pins coupled to the substrate assembly are exposed in the cartridge housing; and mounting a spring clip to the cartridge housing, the spring clip including a plurality of load arms contacting the substrate assembly, and including two tab arms substantially perpendicular to the plurality of load arms, each tab arm having tabs that engage the tab engaging points on the cartridge housing, the spring clip being mounted such that the plurality of pins protrude through an opening thereof.

14. The method of claim 13 wherein coupling the substrate assembly to the heat pipe includes forming the bond line between the integrated circuit die and a pedestal feature on the first side of the heat pipe.

15. The method of claim 14 further comprising disposing a thermally conductive material on the pedestal feature of the heat pipe.

16. The method of claim 14 further comprising disposing a thermally conductive material on the integrated circuit die.

17. A method of assembling a cartridge for housing an integrated circuit die, the method comprising:

coupling a heat pipe to a cartridge housing, the heat pipe having a first side and an opposing side, the opposing side contacting the cartridge housing, the cartridge housing having a plurality of tab engaging points on an external surface;

coupling a substrate assembly that includes the integrated circuit die to the heat pipe, such that a junction between the integrated circuit die and the first side of the heat pipe forms a bond line;

mounting a spring clip to the cartridge housing, the spring clip including a plurality of load arms contacting the substrate assembly, and including two tab arms substantially perpendicular to the plurality of load arms, each tab arm having tabs that engage the tab engaging points on the cartridge housing;

registering a cartridge cover with the substrate assembly; and fastening the cartridge cover to the cartridge housing.

18. The method of claim 17 wherein registering the cartridge cover with the substrate assembly comprises aligning key features on the cartridge cover with keyway features on the substrate assembly.

19. The method of claim 18 wherein fastening the cartridge cover to the cartridge housing comprises:

passing a plurality of fasteners through elongated holes on the cartridge cover; and engaging each of the plurality of fasteners with a separate cartridge cover attaching point on the cartridge housing.

20. A method of assembling a cartridge for housing an integrated circuit die, the method comprising:

coupling a heat pipe to a cartridge housing, the heat pipe having a first side and an opposing side, the opposing side contacting the cartridge housing, the cartridge housing having a plurality of tab engaging points on an external surface;

mounting an integrated circuit die to a first substrate side of a substrate;

mounting a pin connector to a second substrate side of the substrate to create a substrate assembly, the second substrate side being substantially parallel to the first substrate side;

coupling the substrate assembly to the heat pipe, such that a junction between the integrated circuit die and the first side of the heat pipe forms a bond line; and mounting a spring clip to the cartridge housing, the spring clip including a plurality of load arms contacting the substrate assembly, and including two tab arms substantially perpendicular to the plurality of load arms, each tab arm having tabs that engage the tab engaging points on the cartridge housing.

* * * * *